US006770498B2

(12) United States Patent
Hsu

(10) Patent No.: US 6,770,498 B2
(45) Date of Patent: Aug. 3, 2004

(54) LED PACKAGE AND THE PROCESS MAKING THE SAME

(75) Inventor: Cheng-Hsiang Hsu, Taichung (TW)

(73) Assignees: Lingsen Precision Industries, Ltd., Taichung (TW); Cotco Holdings Ltd., Kwai Chung (HK)

(*) Notice: Subject to any disclaimer, the term of this patent is extended or adjusted under 35 U.S.C. 154(b) by 56 days.

(21) Appl. No.: 10/263,805

(22) Filed: Oct. 4, 2002

(65) Prior Publication Data
US 2004/0000727 A1 Jan. 1, 2004

(30) Foreign Application Priority Data

Jun. 26, 2002 (TW) ....................................... 91113988 A

(51) Int. Cl.⁷ ............................................... H01L 21/66

(52) U.S. Cl. .......................................... 438/26; 438/29

(58) Field of Search ............................. 438/26, 27, 28, 438/29, 34; 257/98, 99, 100, 79, 81, 787

(56) References Cited

U.S. PATENT DOCUMENTS 5,698,866 A * 12/1997 Doiron et al. ................. 257/99
6,670,648 B2 * 12/2003 Isokawa et al. ............... 257/99
6,707,069 B2 *  3/2004 Song et al. .................... 257/79

* cited by examiner

Primary Examiner—Sara Crane
(74) Attorney, Agent, or Firm—Browdy and Neimark

(57) ABSTRACT

The present invention is to provide a process for fabricating light emitting diode (LED) packages. The process begins with a first step of providing a platelike frame having a plurality of cells, each of which is composed of a main plate and a separate arm. Secondly, an LED die and a reflecting ring are respectively mounted on a top surface of each main plate such that the die is located at a center of the reflecting ring. Next, connect a conductive wire between a top surface of the die and a top surface of the separate arm by wire bonding technique. And then, mold a domed transparent encapsulant on each of the cells. The encapsulant encapsulates the die, the reflecting ring and the conductive wire and covers the main plate and the separate arm, and fills a space between the main plate and the separate arm to remain their spaced apart. Finally, cut the frame according to the size of each cell, and then LED packages are obtained.

5 Claims, 8 Drawing Sheets

LED PACKAGE AND THE PROCESS MAKING THE SAME

FIELD OF THE INVENTION

The present invention relates generally to photoelectric semiconductor, and more particularly to a process for fabricating a light emitting diode (LED) package and the structure of the LED package.

BACKGROUND OF THE INVENTION

A conventional lamp-typed LED package is made by the following process. Firstly, provide a frame made of an electrically conductive metal. The frame has a numbers of pairs of leads arranged parallel and interconnected with each others through a cross bar. Each pair of leads is served as a positive pole and a negative pole of one LED package. On one of the poles, generally the negative pole, a bowl-shaped recess defining a reflecting surface for reflecting light is formed. Next, an LED die is attached on a bottom of the bawl-shaped recess of each negative pole by an electrically conductive adhesive, e.g. silver adhesive, such that an N-electrode of the LED die is electrically connected to the negative pole. Then, a P-electrode of each LED die is electrically connected to the other lead, i.e. the positive pole, through a gold wire by wire-bonding technique. By means of a molding technique, the LED dies are then respectively encased by a dome-shaped epoxy resin encapsulant with the metallic leads partially projecting out of the respective encapsulant and the cross bar is exposed outside the encapsulants. Finally, the cross bar is cut to obtain a numbers of LED packages.

Compared with other lighting devices, such as fluorescent lamps and incandescent lamps, the heat emitted by the LED package is low, but a certain amount of the heat, which is generated while the LED die glows by the electricity of from tens to hundreds of milliamperes, is a major factor resulted in the damage of the LED package. Accordingly, the present research and improvement is also focused on reducing the heat generated by the LED die. As far as the foregoing prior art LED package is concerned, the die is encapsulated in the epoxy encapsulant, which thermal conductivity is poor, and the contact area between the die and one of the leads is small. Besides, a protrudent portion of the leads out of the encapsulant is in the shape of a thin bar, so that the thermal conductivity of the above-mentioned conventional LED package is very poor and further improvement is required.

SUMMARY OF THE INVENTION

The primary objective of the present invention is to provide a process for fabricating LED packages, whereby a better thermally conductive and durable LED packages are made.

To achieve the foregoing objective of the present invention, the process for fabricating LED packages involves the following steps. Step A: Provide a platelike frame made of an electrically conductive metal. The frame has a plurality of cells, each of which includes a main plate and a separate arm, and no connection but a space between the main plate and the separate arm. Step B: Attach an LED die on a top surface of each main plate of the frame so as to electrically connect an electrode on a bottom side of the die to the main plate. Moreover, form a reflecting ring on each main plate with a molding technique, wherein the reflecting ring is made of opaque white plastic and has an upward sloping inner surface, and the die is positioned in the center of the reflecting ring. Step C: Connect the other electrode on a top surface of the die to a top surface of the separate arm with a conductive wire by means of wire bonding technique. Step D: Form an encapsulant on each cell of the frame with epoxy resin by means of the molding technique, wherein the encapsulant encapsulates the die, the reflecting ring and the conductive wire, and covers the main plate and the separate arm and also fills the space between the main plate and the separate arm to remain their spaced apart in opposite relationship. Additionally, the encapsulant has a top domelike protrusion. Step E: Cut the platelike frame substantially according to the size of each of the cells such that a plurality of LED packages are made.

DETAILED DESCRIPTION OF THE INVENTION

Figure 1:
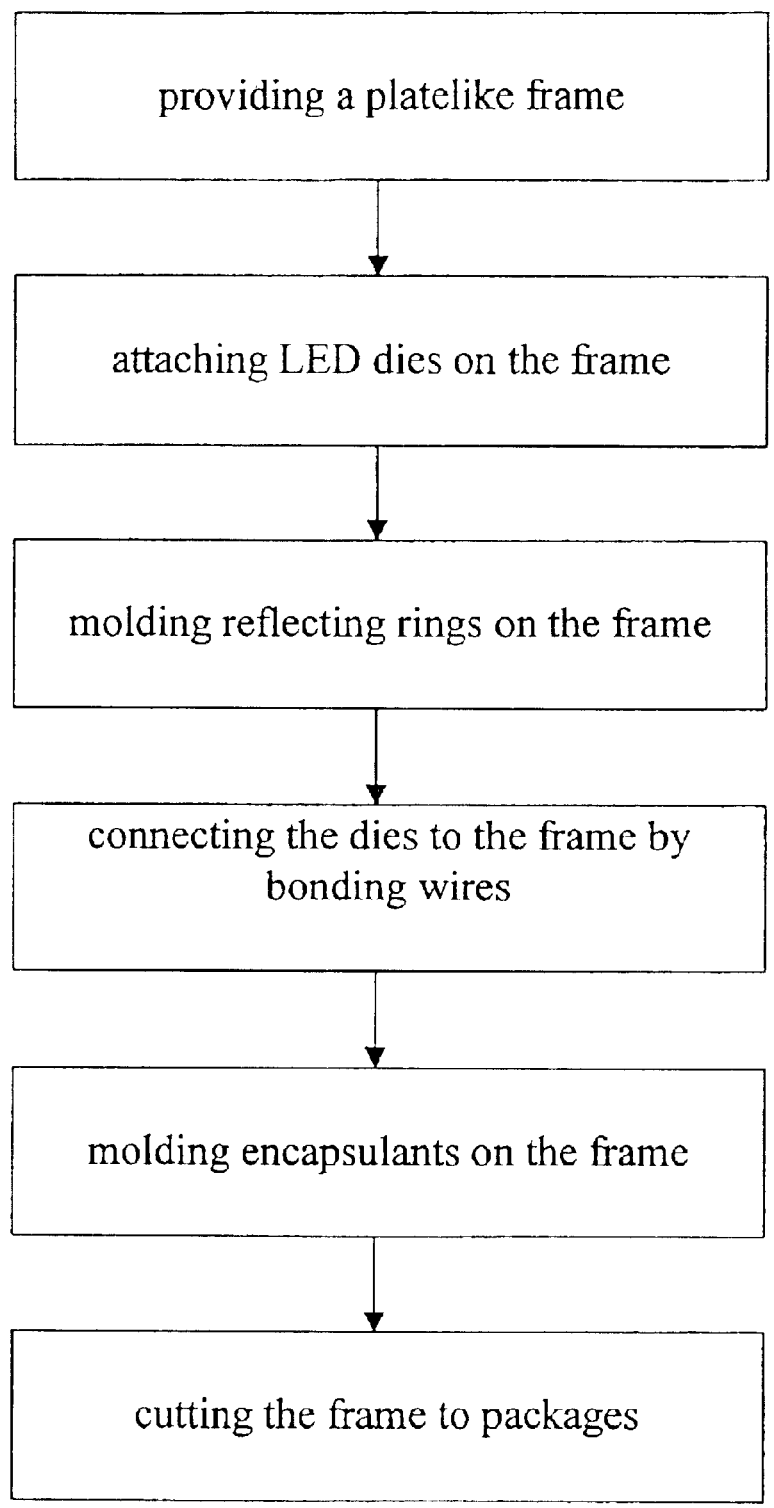
FIG. 1 is a flow chart showing a process for fabricating LED packages of a preferred embodiment in accordance with the present invention.

The preferred embodiment of the present invention is to provide a process for fabricating white LED packages. However, it is to be understood that this process can be applied to make any kind of the LED lamp packages. Referring to FIG. 1, a flow chart of a fabricative process of the present invention includes six steps of plate-like frame providing, die bonding, reflecting ring molding, wire bonding, encapsulant molding, and cutting. The details of the steps will be illustrated hereunder with the accompanying drawings.

Figure 2:
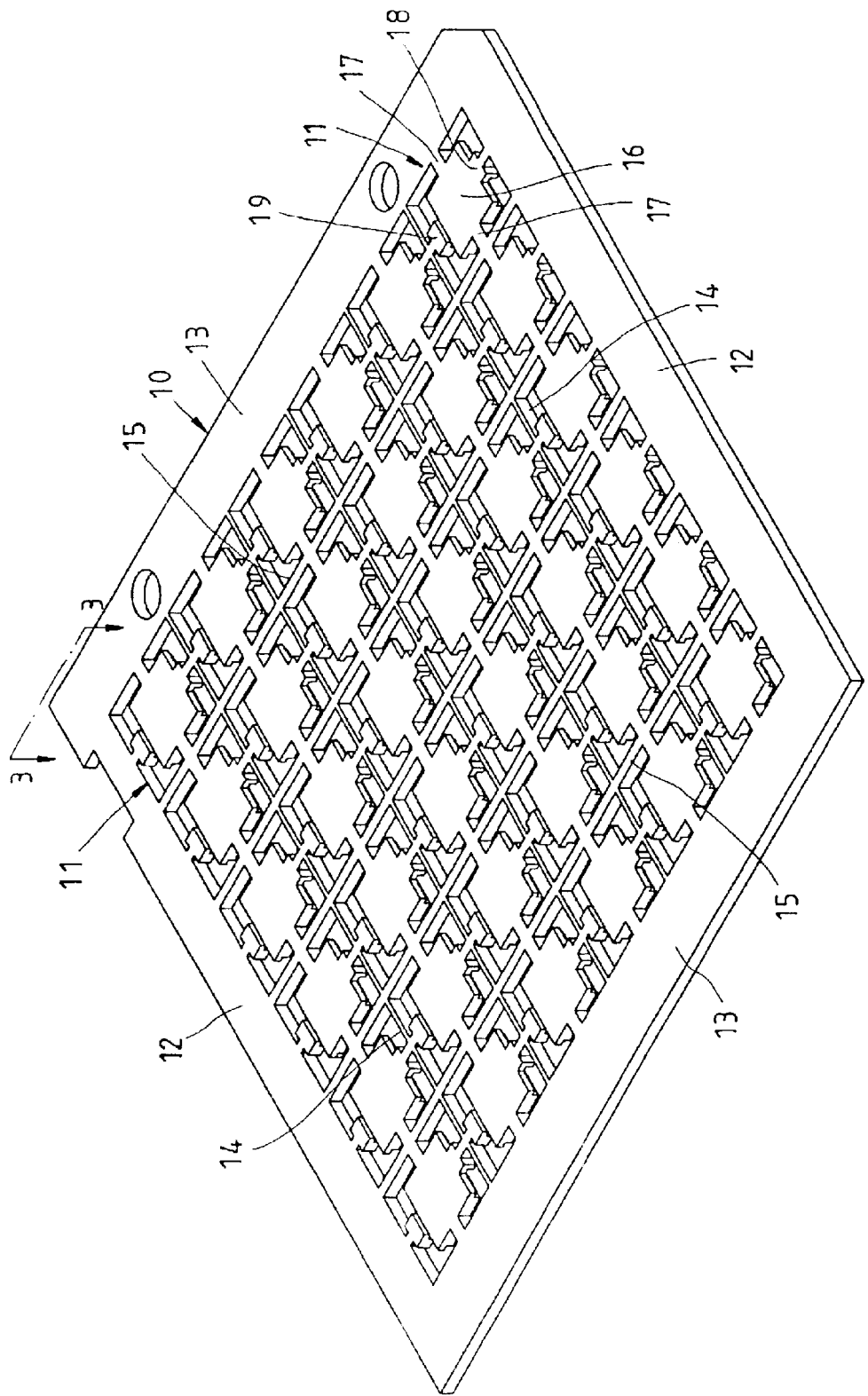
FIG. 2 shows semi-finished LED packages of the first step according to FIG. 1.
Figure 3:
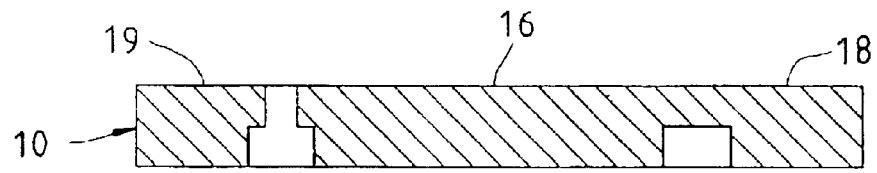
FIG. 3 is a cross-sectional view taken along the direction indicated by the line 3—3 as shown in FIG. 2.

Step 1: Referring to FIGS. 2–3, firstly, provide a plate-like frame 10, which is substantially rectangle and has a plurality of cells 11. The cells 11, each of which has a plurality of openings, are well positioned in an arrangement of matrix. Namely, the cells 11 are surrounded by left and right lateral sides, which are defined as two longitudinal lateral bars 12, and upper and lower sides, which are defined as two transversal lateral bars 13, wherein each of the cells 11 is comparted by a plurality of longitudinal dividing bars 14 and transversal dividing bars 15. The openings of the cell 11 are alike in shape, that is, the cell 11 has a rectangle main plate 16 at a center thereof, and two bridges 17 respectively at two centers of the upper and the lower lateral sides to connect the main plate 16 and the transversal dividing bar 15 or the transversal lateral bars 13, and an extending arm 18 at the middle of right lateral side of the cell 11 to connect the main plate 16 and the longitudinal dividing bars 14 or the longitudinal lateral bars 12, and an separate arm 19 at the middle of left lateral side of the cell 11 to connect only the longitudinal dividing bar 14 or the longitudinal lateral bar 12 but to be spaced apart from the main plate 16.

Figure 5:
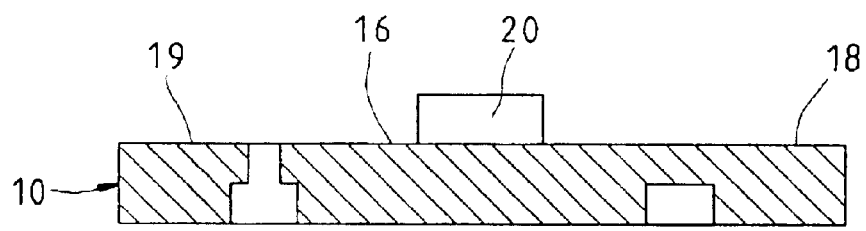
FIG. 5 is a cross-sectional view taken along the direction indicated by the line 5—5 as shown in FIG. 4.
Figure 4:
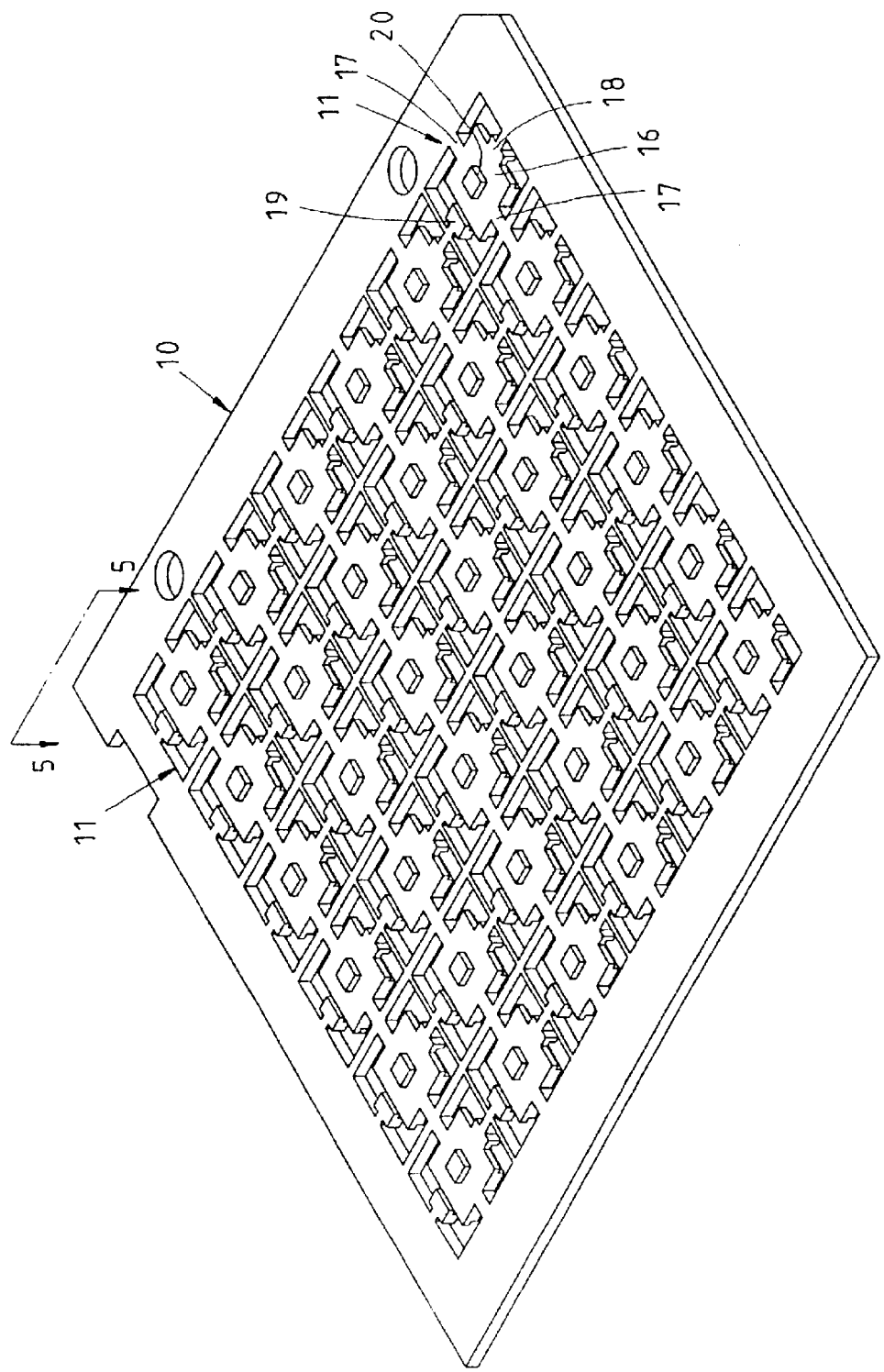
FIG. 4 shows semi-finished LED packages of the second step according to FIG. 1.

Step 2: Referring to FIGS. 4–5, a white LED die 20 is bonded on a top surface of each of the main plates 16 of the frame 10 by means of silver adhesives (not shown). The die 20 has a bottom to be smoothly bonded on the top surface of the main plate 16 such that an electrode positioned on the bottom of the die 20 directly electrically contacts the main plate 16 by means of the silver adhesive. Please note that the LED die 20 is a prior art, which epitaxy structure and how to glow are irrelevant to the present invention, will not recited thereafter. In addition, the technique of die bonding is also a prior art.

Figure 7:
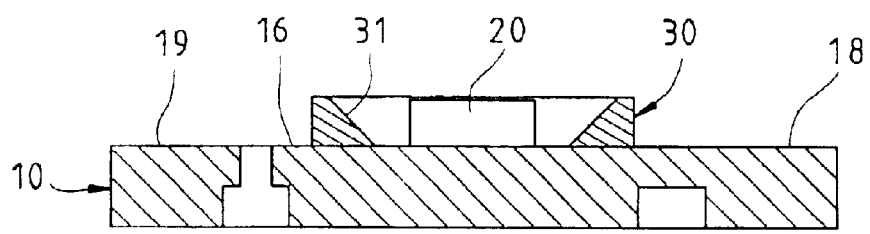
FIG. 7 is a cross-sectional view taken along the direction indicated by the line 7—7 as shown in FIG. 6.
Figure 6:
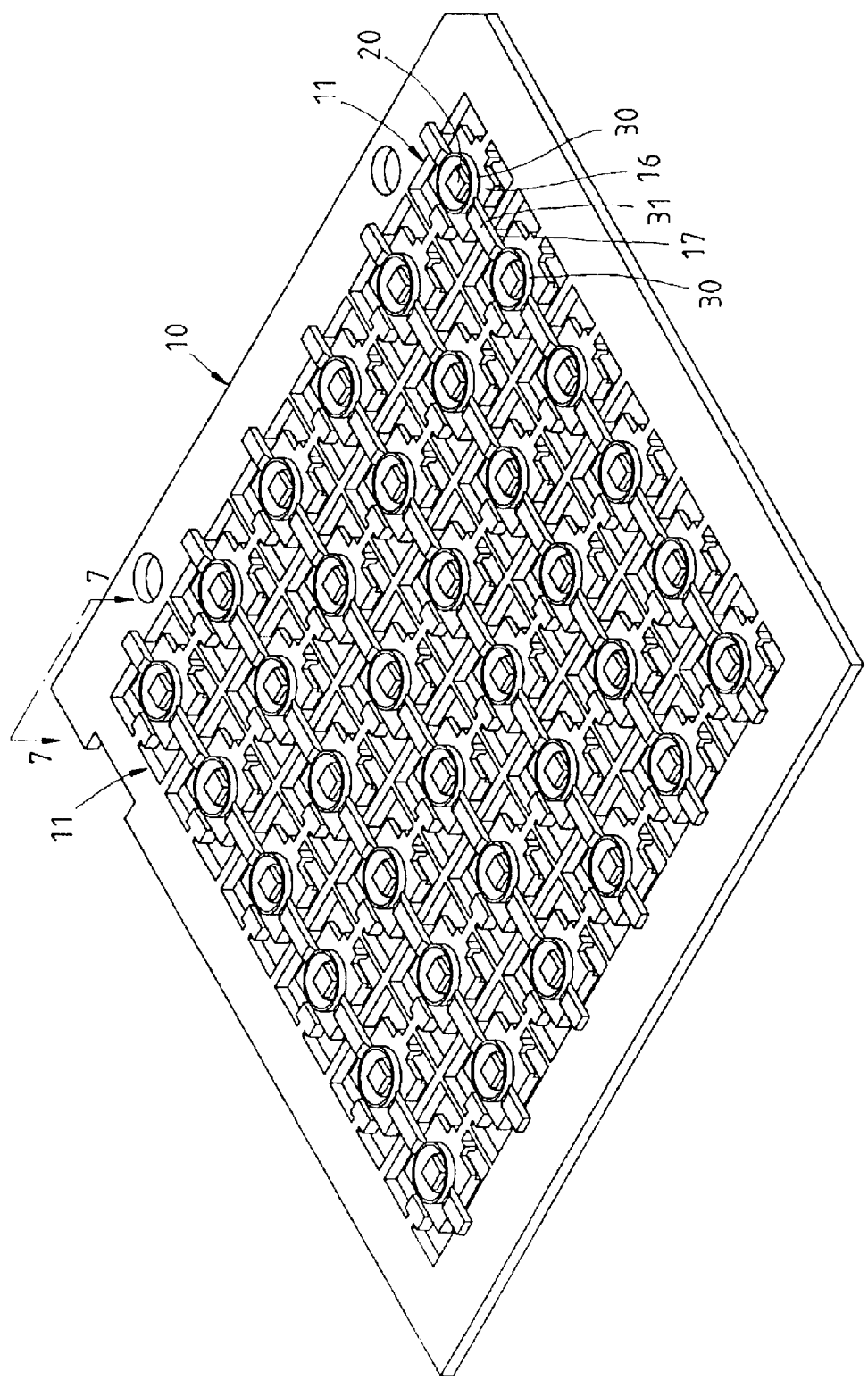
FIG. 6 shows semi-finished LED packages of the third step according to FIG. 1.

Step 3: Referring to FIGS. 6–7, form a reflecting ring 30, which is bonded on each of the main plates 16 of the frame 10, with plastic materials by means of injection molding technique. The reflecting ring 30, which axial height is almost the same with the die's 20 and which is made of opaque white material, surrounds the die 20 and has an inner surface 31, which is a slope facing upward with an angle of 45° to reflect the light emitted by the die 20. Further, to facilitate the molding operation, the neighboring reflecting rings 30 in the same row are connected with a connecting bar 32, which is mounted on the bridges 17 of the frame 10. The applicant would like to clarify that the step 3 can be prior to step 2, i.e., form the reflecting ring 30 on the frame 10 first, and then bond the die 20 on the main plate.

Figure 9:
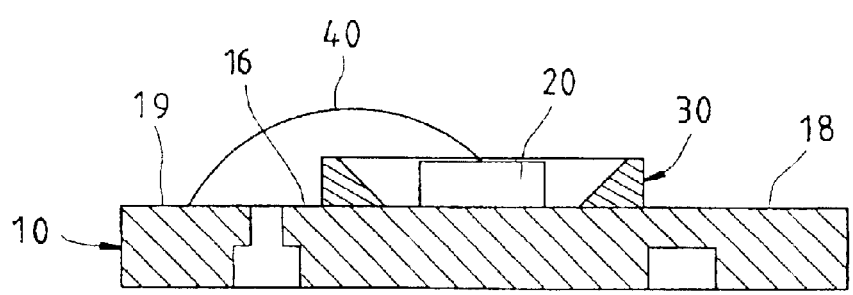
FIG. 9 is a cross-sectional view taken along the direction indicated by the line 9—9 as shown in FIG. 8.
Figure 8:
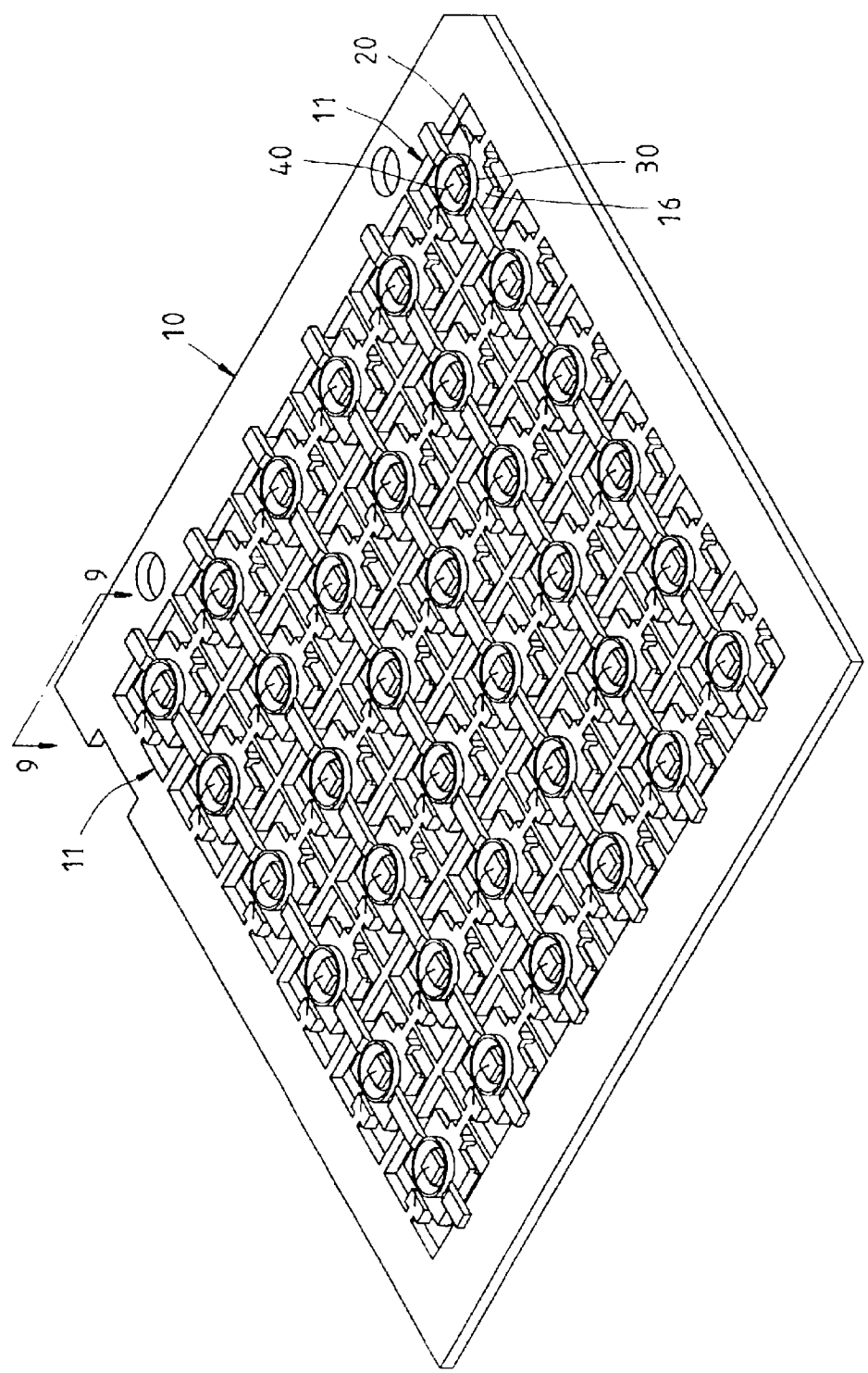
FIG. 8 shows semi-finished LED packages of the fourth step according to FIG. 1.

Step 4: Referring to FIGS. 8–9, connect a top surface of the die 20 to a top surface of the separate arm 19 of the cell 11 with a gold conductive wire 40 of 99% Au by wire bonding technique such that the other electrode positioned on the top surface of the die 20 can be electrically connected with the separate arm 19.

Figure 10:
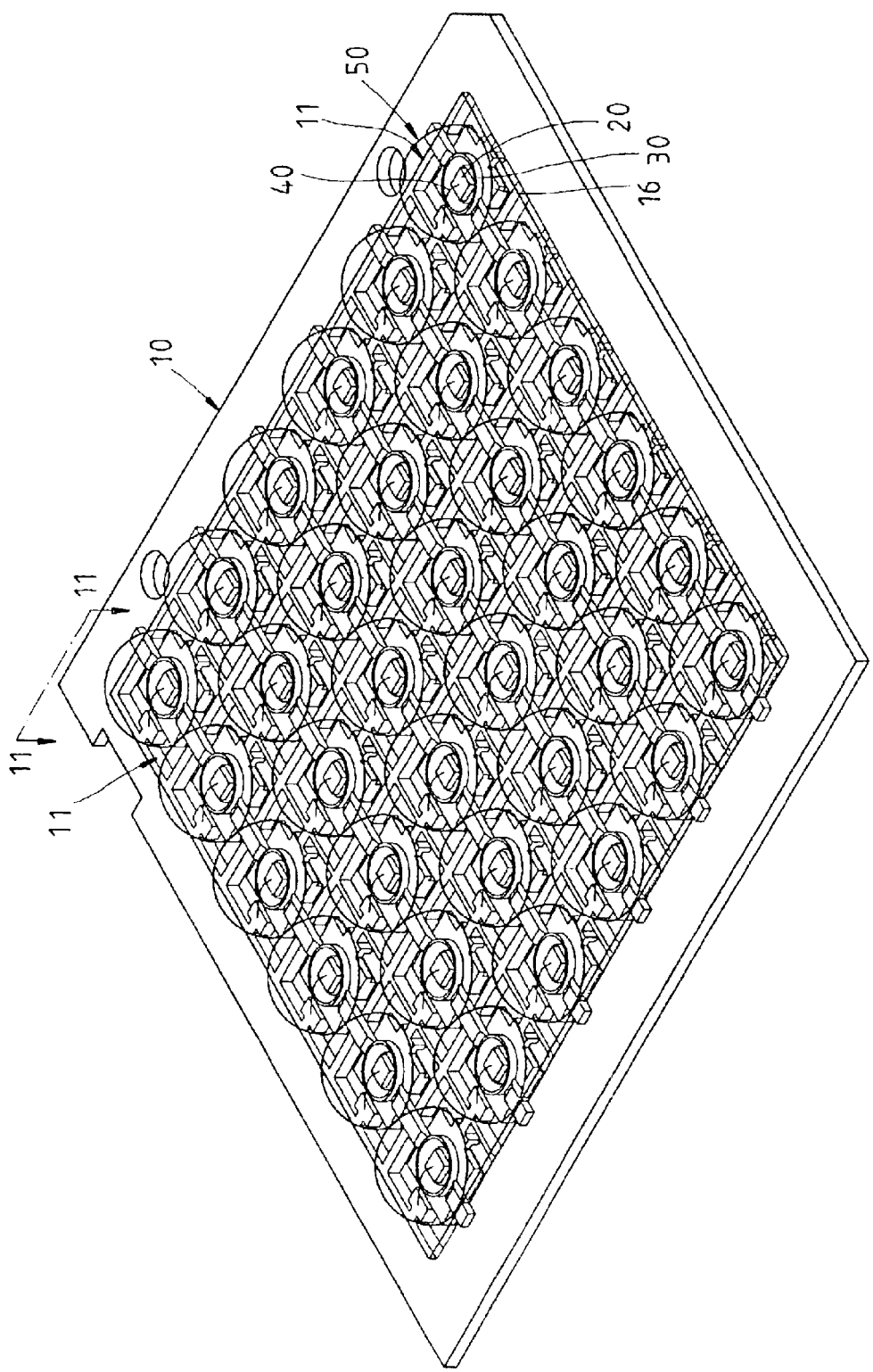
FIG. 10 shows semi-finished LED packages of the fifth step according to FIG. 1.
Figure 11:
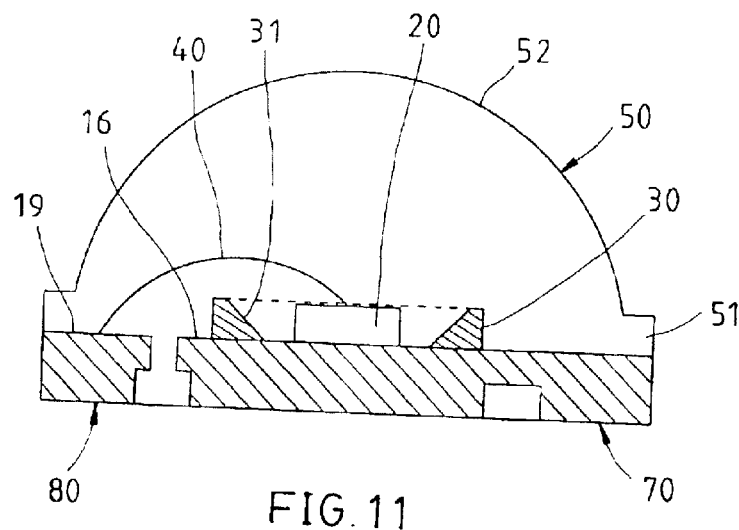
FIG. 11 is a cross-sectional view taken along the direction indicated by the line 11—11 as shown in FIG. 10.

Step 5: Referring to FIGS. 10–11, form an encapsulant 50 on each of the cells 11 of the frame 10 with epoxy resin by means of the injection molding technique. The encapsulant 50 has a rectangle base 51, which corresponds to the cell 11 in size and fills the openings of the cell 11 and covers the surface of the frame 10 with a predetermined thickness. All the bases 51 of the encapsulants 50 are integrated together initially, so that the encapsulants 50 not only cover the main plates 16, the bridges 17, the extending arms 18 and the separate arms 19 of the cells 11 but also the dividing bars 14 and 15 of the frame 10. In this embodiment of the present invention, the base 51 is higher than the frame 10 and substantially as high as the reflecting ring 30. The encapsulant 50 has a top domelike protrusion 52, which is located on the top of the base 51 and integrated with the base 51, and not only encapsulates the die 20, the reflecting ring 30, and the conductive wire 40 on the cell 11 to maintain the mechanism of the die 20 and to prevent water from infiltration, but also reflects the light emitted by the die 20 through the inner surface 31 of the reflecting ring 30. In addition, the encapsulant 50 is an insulator.

Step 6: Cut the frame 10 according to the size of each of the cell 11, or smaller, by cutting out the lateral bars 12 and 13 and the dividing bars 14 and 15 of the frame 10 such that LED packages 60 are made.

Figure 12:
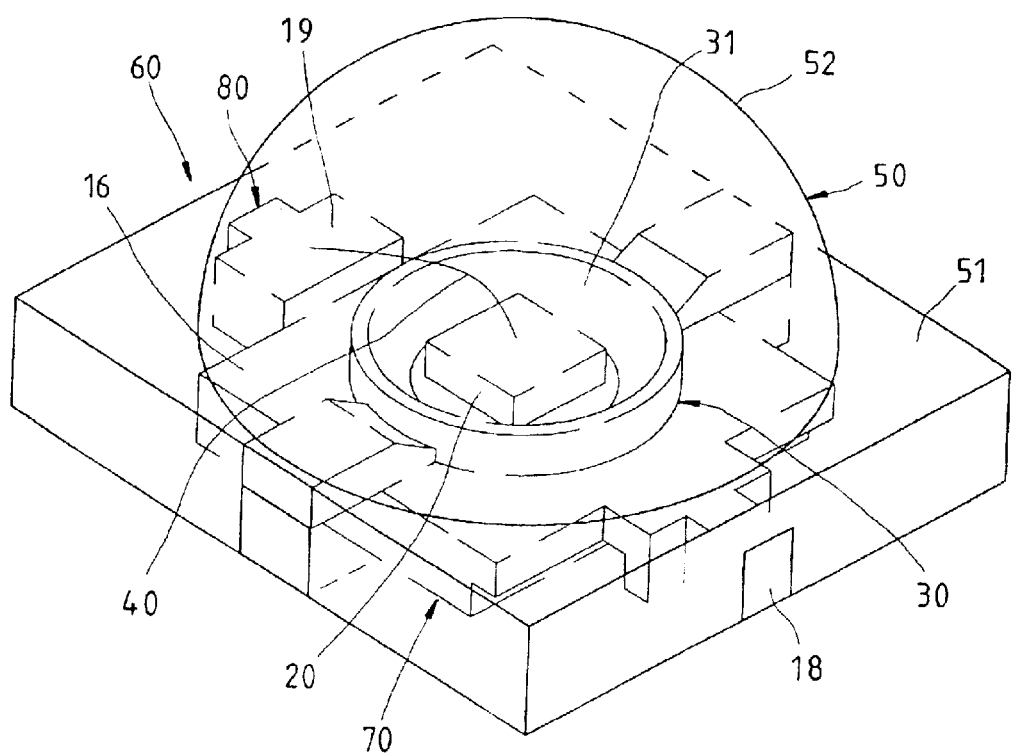
FIG. 12 shows a finished LED package of the preferred embodiment of the present invention.

Referring to FIGS. 11–12, the LED 60 package made by the foregoing fabricative process structurally includes a first terminal 70, a second terminal 80, the LED die 20, the reflecting ring 30, the conductive wire 40, and the encapsulant 50. The first terminal 70 is formed by the main plate 16, the extending arm 18 located at a right side of the main plate 16, and the bridges 17 respectively located at upper and lower sides of the main plates 16. Additionally, the first terminal 70 is made of an electrically conductive metal. The second terminal 80, which is the separate arm 19, is located at a left side of the first terminal 70 and spaced an appropriate distance apart from the first terminal 70 and made of the same electrically conductive metal. The LED die 20 has a bottom, which is smoothly bonded to a top surface of the main plate 16 of the first terminal 70 such that an electrode at the bottom of the LED die 20 is electrically connected to the first terminal 70. The reflecting ring 30, which is made of an opaque white plastic material, is molded on the top surface of the main plate 16 of the first terminal 70 by means of the injection molding technique and surrounds the die 20 and has the inner surface 31 facing upward as a slope. The conductive wire 40 is connected between the other electrode of the top surface of the die 20 and the top surface of the second terminal 80. The encapsulant 50, which material is the insulated epoxy resin with high transparency, encapsulates the die 20, the reflecting ring 30, and the conductive wire 40. Additionally, the base 51 of the encapsulant 50 covers the top surface of the first terminal 70 and the second terminal 80 and fills the space therebetween to remain two terminals 70 and 80 spaced apart in opposite relationship. The top of the encapsulant 50 is formed as the domed protrusion 52. When the LED package 60 is in use, generally take the first terminal 70 as positive electrode and the second terminal 80 as negative electrode such that the LED die 20 is charged by the electricity to emit white light. The emitted white light is then reflected from the inner surface 31 of the reflecting ring 30 to the dome-shaped protrusion of the encapsulant 50.

As a conclusion, the LED die 20 has a bottom being smoothly bonded on the top surface of the metallic main plate 16, so that the contact area between the die 20 and the main plate 16 is preferably large. Moreover, the main plate 16, more precisely, the first terminal 70 has a large bottom surface to be totally exposed outside, so that the heat generated by the die 20 can be conducted to the first terminal 70 and further conducted outside from the bottom surface of the first terminal 70 while the LED package 60 is charged. Therefore, the LED package 60 of the present invention is provided with excellent efficiency of thermal dissipation so as to be durable for a long time.

What is claimed is:

1. A process for fabricating light emitting diode (LED) packages, comprising the steps of:

(a) providing a platelike frame having a plurality of cells, each of which has a main plate and a separate arm, wherein said separate arm is spaced apart from said main plate with a predetermined space;

(b) bonding an LED die on a top surface of said main plate of each said frame such that an electrode located at a bottom of said die is electrically connected to said main plate, and then forming a reflecting ring, which is made of opaque white plastic and has an upward sloping inner surface, integrally on said main plate by means of the molding technique, wherein said die is surrounded by said reflecting ring;

(c) connecting a conductive wire between the other electrode of said die and a top surface of said separate arm by means of the wire bonding technique;

(d) forming an encapsulant on each said cell of said frame with epoxy resin by means of the molding technique, wherein said encapsulant encapsulates said die, said reflecting ring and said conductive wire and covers said main plate and said separate arm and fills the space therebetween to remain said main plate spaced apart from said separate arm, wherein said encapsulant is provided with a top domelike protrusion;

(e) cutting said frame substantially according to the size of each said cell such that LED packages are made.

2. The process as defined in claim 1, wherein in step (b), bonding said die is prior to forming said reflecting ring.

3. The process as defined in claim 1, wherein in the step (a), all said cells of said frame are well arranged in the shape of matrix and have a plurality of openings thereon and said main plate at a center thereof, and two bridges connecting to an edge of said cell are respectively connected to two centers of two opposite lateral sides of said main plate, and an extending arm connecting to an edge of said cell is connected to the middle of another lateral side of said main plate, and said separate arm is located at a lateral side opposite to said extending arm; in the step (b), a connecting bar links with two neighboring reflecting rings of the same row and said connecting bar is attached on said bridges of said frame.

4. The process as defined in claim 1, wherein in the step (b), said die is a white LED die.

5. The process as defined in claim 1, wherein in the step (b), said sloping inner surface of said reflecting ring has a sloping angle of 45°.

* * * * *